United States Patent [19]
Tosaka et al.

[11] Patent Number: 5,883,839
[45] Date of Patent: Mar. 16, 1999

[54] WAVEFORM STABILIZING DRIVE CIRCUIT FOR MODULARIZED MEMORY

[75] Inventors: Masaki Tosaka; Yuzo Usui; Noriyuki Matsui; Masao Matsuda; Kazunori Kasuga, all of Kawasaki, Japan

[73] Assignee: Fujitsu Limited, Kawasaki, Japan

[21] Appl. No.: 944,552

[22] Filed: Oct. 7, 1997

[30] Foreign Application Priority Data

Oct. 31, 1996 [JP] Japan ................................. 8-290134

[51] Int. Cl.⁶ .................................................. G11C 7/00
[52] U.S. Cl. ................... 365/189.05; 365/206; 365/214
[58] Field of Search ............................. 365/189.05, 63, 365/206, 214

[56] References Cited

U.S. PATENT DOCUMENTS 5,727,182  3/1998  Fukushima et al. ............... 365/189.05
5,729,764  3/1998  Sata ................................... 365/189.05

FOREIGN PATENT DOCUMENTS 3-25993   2/1991  Japan .
4-62895   2/1992  Japan .
5-143535  6/1993  Japan .
9-214076  8/1997  Japan .

*Primary Examiner*—Vu A. Le
*Attorney, Agent, or Firm*—Staas & Halsey

[57] ABSTRACT

A memory drive circuit includes at least one memory module constructed of a plurality of memory elements, a memory controller for driving said memory module, and a buffer, disposed between the memory module and the memory controller, for receiving a drive signal from the memory controller and transmitting the received drive signal to the memory module. Signal reflection noises produced in the memory module are absorbed by the buffer.

9 Claims, 6 Drawing Sheets

WAVEFORM STABILIZING DRIVE CIRCUIT FOR MODULARIZED MEMORY

BACKGROUND OF THE INVENTION

The present invention relates to a circuit for driving a modularized memory.

In en electronic calculator such as a personal computer, etc., it has been generally proposed to include modularized memory. The modularized memory is, as illustrated in, e.g., FIG. 10, packaged with a plurality of memory modules and also packaged with a memory controller MC for driving these memory modules. The modularized memory is constructed by connecting the memory controller MC to the memory modules through connectors.

Each memory module is constructed by connecting dynamic RAMs (DRAMs) through a wire pattern, and therefore, if packaged with the plurality of memory modules, the wires within the memory modules take a stubby shape (branch wiring).

The number of DRAMs packaged in the memory module differs depending on a capacity of each DRAM. For instance, in the case of constructing an 8 Mbit memory module by use of 16 Mbyte DRAMs, the number of the DRAMs packaged in the memory module is 4. Further, in the case of constructing the 8 Mbyte memory module by use of 4 Mbit DRAMs, the number of the DRAMs packaged in the memory module is 16. Thus, the capacity of the memory module differs depending on the capacity and the number of the DRAMs packaged therein.

When writing data to the above-described memory circuit, the memory controller MC accumulates electric charge in a capacitor (an electrostatic capacity element) constituting the DRAM to discharge the capacitor. On the other hand, when reading the data from the memory circuit, the memory controller MC refers to whether or not there exists an electric charge accumulated in the capacitor (the electric charge being therein: "1", and no electric charge being therein: "0"), In the prior art memory drive circuit described above, there might be a stubby wire arrangement in the memory module, and hence the wire impedance is mismatched. When the memory controller MC transmits a signal to the memory module, the signal is reflected due to the mismatching of the impedance. The reflected signal (hereinafter referred to as a refection noise) runs through the wire connecting the memory module to the memory controller and is then overlapped with the signal from the memory controller MC.

In this case, the signal transmitted from the memory controller to the memory module may be any of several signals. This transmitted signal may be a write enable signal (WE) assuming a high level (H) when effecting a read process from the memory module and assuming a low level (L) when effecting a write process thereto. The transmitted signal may be a row address strobe (RAS) showing a row address specifying timing of the DRAM constructed of capacitors arrayed in matrix the transmitted signal may be a column address strobe (CAS) indicating a column address specifying timing of the DRAM, and an address signal.

The write enable signal WE, the row address strobe signal RAS, the column address strobe signal CAS and the address signal are defined as edge trigger signals using a point-of-variation of the signal value. Therefore, if these signals are overlapped with the reflection noises, there occurs be a split portion and a stepped portion in the waveform of the signal, resulting in a malfunction of the DRAM.

Further, the reflection noises enlarge as the load capacity of the memory module increases. Therefore, if packaged with the memory modules having different capacities, as in an example of, e.g., FIG. 10, the load capacity of a memory module B is larger than that of a memory module A. Hence, the reflection noises caused in the memory module B are larger than the reflection noises produced in the memory module A. The reflection noises produced in the memory module B might therefore influence even the memory elements of the memory module A.

Moreover, when extending the memory modules, the load capacity of the whole memory circuit increases. Consequently a rising time and a falling time of the signal outputted from the memory controller MC must be elongated, with the result that a timing error occurs due to a longer delay. A method of preventing such a timing error may be a method of enhancing the driving capability of the memory controller. If the number of packaged memory modules is small, however, an overshoot or a undershoot is caused, resulting in a malfunction of the DRAM.

SUMMARY OF THE INVENTION

The present invention aims at enhancing performance of a circuit packaged with memory modules having a variety of configurations. The invention should provide for stabilizing a waveform of a signal transmitted and received within the circuit as well as giving a high quantity thereto while restraining a delay within the circuit.

To accomplish this object, a memory drive circuit according to the present invention comprises at least one memory module constructed of a plurality of memory elements, a memory controller for driving the memory module, and a buffer, disposed between the memory module and the memory controller, for receiving a drive signal from said memory controller and transmitting the received drive signal to the memory module.

In this memory drive circuit, drive signals transmitted from the memory controller to the memory module, are temporarily received and transmitted from the buffer to the memory module.

Then, in the memory module, the drive signals are distributed to the respective memory elements. At this time, in each of the memory elements, reflection noises of the drive signals are produced. The reflection noises travel toward the buffer away from the memory module while resisting an advancing direction of the drive signals but are absorbed by the buffer.

Incidentally, although the reflection noises occurred in the memory module are absorbed by the buffer, if an output impedance of the buffer is mismatched to an impedance of the wire for connecting the buffer to the memory module, further reflection noises of the above-described reflection noises might be caused at a connecting portion between the buffer and the wire in some cases.

Such being the case, it is preferable that the output impedance of the buffer be matched to the impedance of the wire.

Moreover, it is also preferable that the impedance of the wire be set to a value within a range of impedances the memory module can take.

Further, a transition time of a signal value outputted from the buffer may be set coincident or lager than a time for which the signal is propagated within the memory module. The "transition time" connoted herein is a time required for changing a first value of a certain signal value to a second value.

According to the memory drive circuit of the present invention, in the circuit packaged with the memory modules having the variety of configurations, the unnecessary reflection noises within the circuit are prevented from being formed, and the signal transmitted and received within the circuit is stabilized in waveform and enhanced in quality. Besides, the delay in the circuit can be restrained.

Other features and advantages of the present invention will become readily apparent from the following description taken in conjunction with the accompanying drawings.

DESCRIPTION OF THE PREFERRED EMBODIMENT

An embodiment of a memory drive circuit according to the present invention will hereinafter be described with reference to the accompanying drawings.

Figure 1:
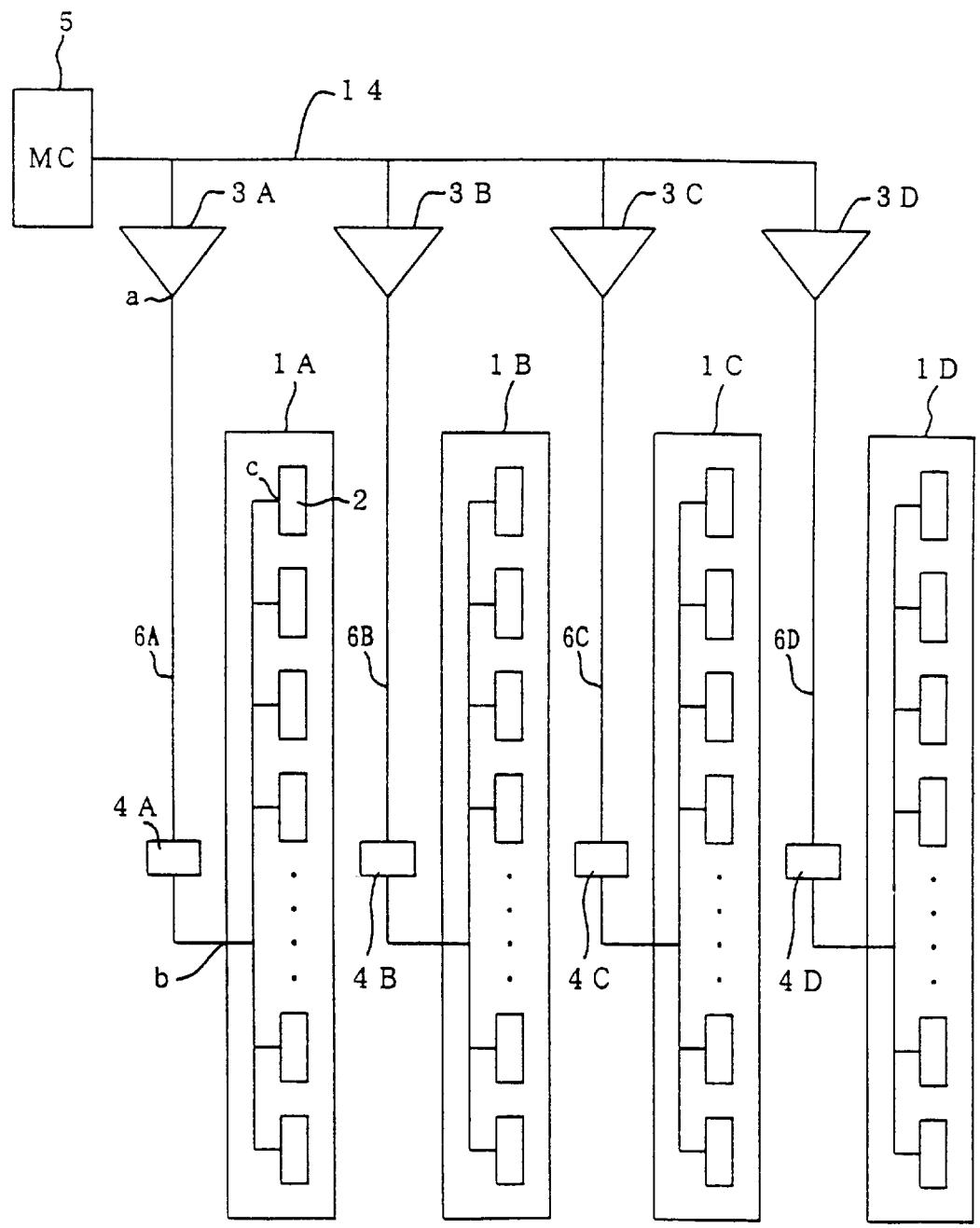
FIG. 1 is a diagram illustrating a construction of a memory drive circuit according to the present invention.

FIG. 1 is a diagram illustrating a construction of the memory drive circuit.

The memory drive circuit includes four pieces of memory modules 1A, 1B, 1C, 1D and a memory controller MC5.

The memory controller MC5 and the four memory modules 1A, 1B, 1C, 1D (that are hereinafter generically termed "memory modules 1") are connected through connectors 4A, 4B, 4C, 4D (that are hereinafter generically termed a "connector 4"). Buffers 3A, 3B 3C, 3D (that are hereinafter generically called "buffers 3") for driving the memory modules 1 on one-to-one basis are provided in between the memory controller MC5 and the connectors 4. Then, output impedances of the buffers 3 are matched to impedances of wire patterns 6A, 6B, 6C, 6D (that are hereinafter generically termed "wire patterns 6") for connecting the buffers 3 to the memory modules 1.

Herein, it is desirable that the output impedances of the buffers 3 and the impedances of the wire patterns 6 be matched to each other with values as small as possible.

Each of the modules 1 has a plurality of dynamic RAMs (DRAMs) 2 serving as memory devices according to the present invention, and these DRAMs 2 are connected through wire patterns.

Figure 2:
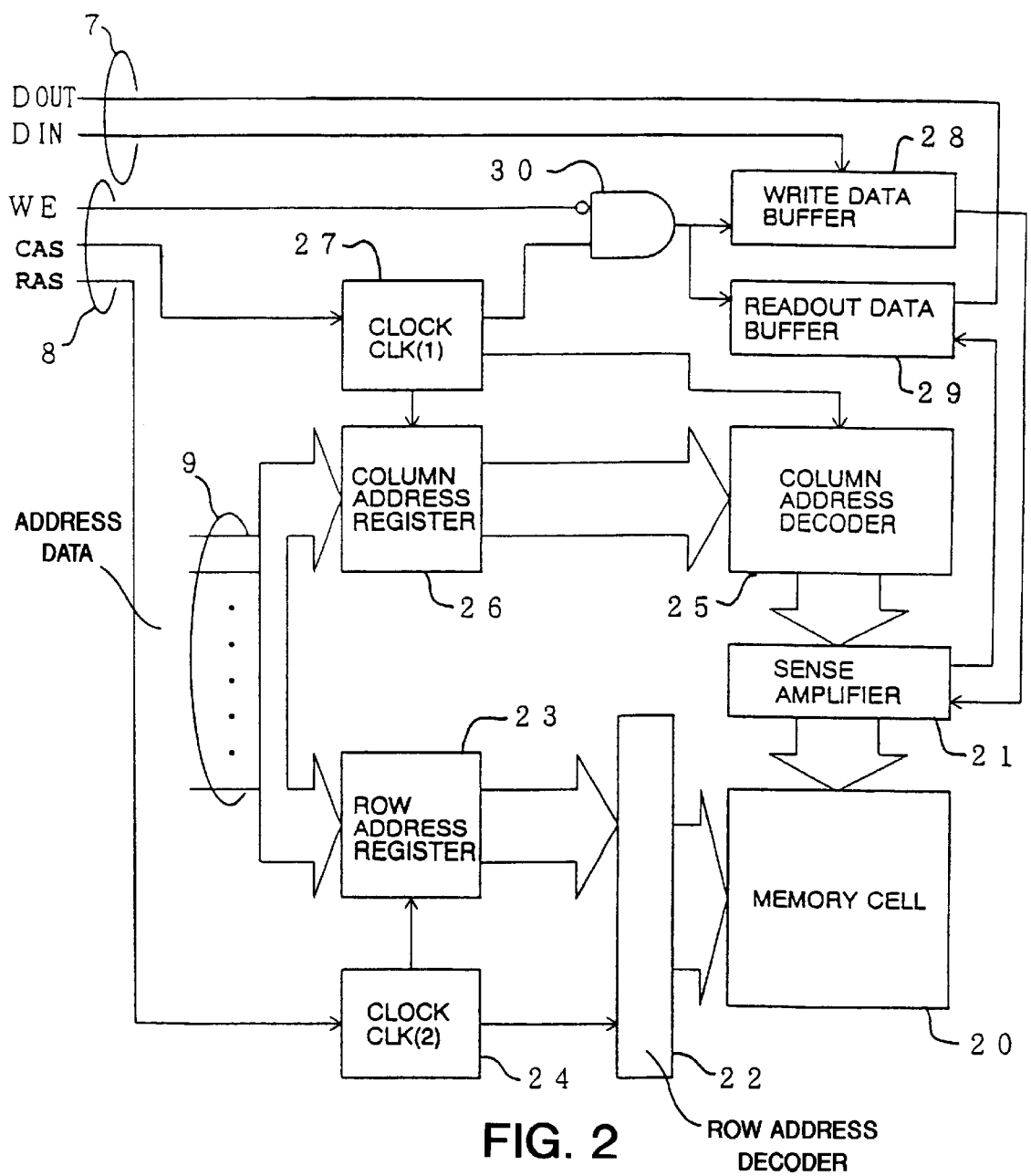
FIG. 2 is a diagram showing an internal configuration of a DRAM.
Figure 3:
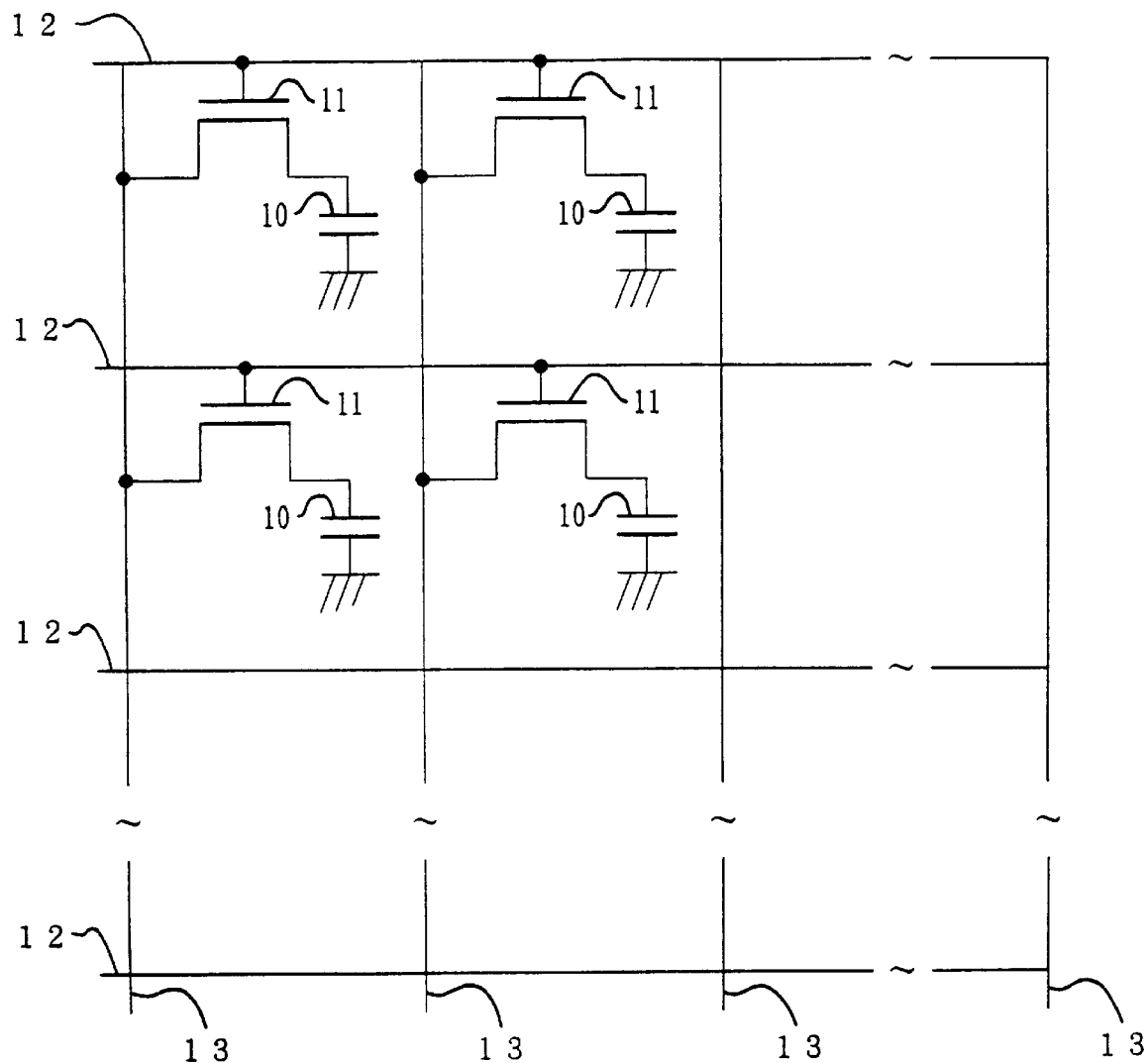
FIG. 3 is a diagram illustrating an internal configuration of a memory cell.

Herein, an internal configuration of the DRAM 2 is explained referring to FIGS. 2 and 3.

The DRAM 2 is connected to the memory controller MC5 through the wire pattern 14 and 16 consisting of a data bus 7 composed of a write data line DIN and readout data line DOUT, a control bus 8 consisting of a write enable signal line, a column address strobe signal line and a row address strobe signal line, and an address bus 9.

Then, the DRAM 2 includes a memory cell 20 constructed of a plurality of storage elements arrayed in matrix, a row address decoder 22 for designating a row address of his memory cell 20, a column address decoder 25 for designating a column address of the memory cell 20, and a sense amplifier 21 for writing or reading data to or from the storage element specified by the row address decoder 22 and the column address decoder 25.

A row address register 23 and a clock CLK(2) 24 are connected to the row address decoder 22, and the address bus 9 is connected to the row address register 23. Connected to the clock CLK(2) 24 are the row address strobe signal line of the control bus 8 and the row address register 23. This clock CLK(2) 24 transmits a clock signal to the row address register 23 and to the row address decoder 22, wherein a receipt of a row address strobe signal RAS serves as a trigger.

Next, a column address register 26 and a clock CLK(1) 27 are connected to the column address decoder 25, and the address bus 9 is connected to the column address register 26. A column address strobe signal line of the control bus 8 is connected to the clock CLK(1) 27. Further, the clock CLK (1) 27 is connected to an AND gate 30, the column address register 26 and the column address decoder 25. This clock CLK(1) 27 transmits a clock signal to the column address register 26, the column address decoder 25 and the AND circuit 30, wherein a receipt of a column address strobe signal CAS serves as a trigger.

The AND gate 30 has two input terminals and one output terminal. One of the two input terminals is connected to the clock CLK(1) 27, and the other of the two input terminals is connected to the write enable signal line of the control bus 8. Then, the output terminal is connected to the write data buffer 28 and the readout data buffer 29. Herein, the AND gate 30 invert-inputs a write enable signal WE transmitted via the write enable signal line. The AND gate 30, when the write enable signal WE assumes a high level (a readout process from the DRAM 2), inverts a high level signal to a low level signal and inputs this low level signal, and further, when the write enable signal WE assumes a low level (a write process to the DRAM 2), inverts the low level signal to the high level signal and inputs this high level signal.

The readout data buffer 29 is constructed of an enable-controlled buffer, and inputs, as an enable signal, a signal outputted from the output terminal of the AND circuit 30. Then, the readout buffer 29, upon receiving a low level signal (L) from the AND circuit 30, takes in the data from the sense amplifier 21 and transmits thus taken-in data to the readout data line DOUT. While on the other hand, the readout data buffer 29, when receiving the high level signal (H) from the AND circuit 30, does not take in the data from the sense amplifier 21.

The write data buffer 28 is constructed of an enable-controlled buffer as in the case of the readout data buffer 29, and inputs, as an enable signal, a signal outputted from the output terminal of the AND circuit 30. However, the readout data buffer 29 makes the low level signal, from the AND circuit 30, the enable signal, whereas the write data buffer 28 makes the high level signal, from the AND circuit 30, the enable signal. Then, the write data buffer 28, when inputting the low level signal from the AND circuit 30, takes in the data transmitted via the write data line DIN and transmits the thus taken-in data to the sense amplifier 21.

Next, the memory cell 20 is constructed in such a way that the storage elements, consisting of a plurality of capacitors 10 and transfer gates 11, as illustrated in FIG. 3, are arrayed in matrix. Each storage element is connected to a word line 12 connected to the row address decoder 22, and to a bit line 13 connected to the sense amplifier 21. The word line 12 is connected to the transfer gate 11 of each storage element, and the bit line 13 is connected to the capacitor 10 via the transfer gate 11 of each storage element.

The transfer gate 11, when driving electric power is applied across the word line 12, makes conduction between the bit line 13 and the capacitor 10.

The above-described DRAM 2, upon receiving the high-level write enable signal WE from the memory controller MC5, reads the data from the memory cell 20. Then, the memory controller MC5 sequentially transmits the row address strobe signal RAS and the row address data subsequent to the write enable signal WE.

At first, the row address strobe signal RAS is transmitted to the clock CLK(2) 24 of the DRAM 2 via the control bus 8. At this time, the clock CLK(2) 24 transmits the clock signal to the row address register 23 and the row address decoder 22.

The row address register 23 receiving the clock signal takes in the row address data from the memory controller MC 5 and transmits the thus taken-in row address data to the row address decoder 22.

The row address decoder 22, when receiving the row address data, applies the driving electric power to the row (the word line 12) indicated by the row address data of the memory cell 20. In the storage element located on the row to which the driving electric power has been applied, the driving electric power is then applied across the transfer gate 11, thereby making conduction between the capacitor 10 and the bit line 13.

Herein, the memory controller MC 5 sequentially transmits the column address strobe signal CAS and the column address data after finishing the transmission of the row address data, and hence this column address strobe signal CAS is transmitted to the clock CLK(1) 27. Then, the clock CLK(1) 27 transmits the clock signals to the column address register 26, the column address decoder 25 and the AND circuit 30.

Then, the column address register 26 receiving clock signal takes in the column address data transmitted via the address bus 9, and transmits the taken-in column address data to the column address decoder 25.

The column address decoder 25 receiving the column address data transmits a signal for specifying the column (the bit line 13) corresponding to the column address data, to the sense amplifier 21.

At this time, the sense amplifier 21 senses the capacitor 10 of the storage element that is located on the column (the bit line 13) specified by the specifying signal, and judges whether electric charge is are accumulated or not. When electric charge is accumulated in the capacitor 10, the sense amplifier 21 transmits a signal "1" to the readout data buffer 29. When electric charge is not accumulated in the capacitor 10, the sense amplifier 21 transmits a signal "0" to the readout data buffer 29.

On the other hand, the AND circuit 30 invert-inputs the high-level write enable signal WE and also inputs the clock signal (high level) from the clock CLK(1) 27. Therefore, it follows that the low-level signals (L) are transmitted to the write data buffer 28 and the readout data buffer 29. At this time, only the readout data buffer 29 operates and takes in the signal ("1" or "0"); from the sense amplifier 21. Then, the readout data buffer 29 transmits the taken-in signal ("1" or "0") to the memory controller MC5 via the DOUT readout data line DOUT 7.

Next, the DRAM 2, on receiving the low-level write enable signal WE from the memory controller MC5, writes data to the memory cell 20. Then, the memory controller MC5 sequentially transmits the row address strobe signal RAS, the column address data, the column address strobe signal CAS, and the column address data subsequent to the write enable signal WE.

Then, the clock CLK(1) 27, the column address register 25, the clock CLK(2) 24, the column address decoder 25, and the row address decoder 22 operate in the same way as in the readout process. One of the plurality of storage elements constituting the memory cell 20 is thereby specified.

Subsequently, the AND circuit 30 invert-inputs the low-level write enable signal WE and also inputs the clock signal (high level) from the clock CLK(1) 27. Hence, it follows that the high-level signals (H) are transmitted to the write data buffer 28 and the readout data buffer 29. At this time, only the write data buffer 28 operates and takes in the signal ("1" or "0") transmitted via the DIN write data line from the memory controller MC5. Then, the write data buffer 28 transmits the taken-in signal ("1" or "0") to the sense amplifier 21.

Then, the sense amplifier 21 writes the signal ("1" or "0") from the write data buffer 28, to the capacitor 10 of the storage element specified by the row and column addresses. For example, when the signal from the write data buffer 28 is "1", the sense amplifier 21 accumulates electric charge in the capacitor 10. When the signal from the write data buffer 28 is "0", the sense amplifier 21 discharges the capacitor 10 accumulated so far with electric charge.

The operation and effect of this embodiment will hereinafter be explained.

When the signals are transmitted from the memory controller MC5 via the wire pattern 14, the signals are then transmitted to the memory modules 1 via the buffers 3, the connectors 4 and the wire patterns 6. At this time, reflection noises of the signals occur at the connecting points (points b in FIG. 1) between the wire patterns 6 and the memory modules 1 due to mismatching of the impedances of the wire patterns 6 to the impedances of the memory modules 1.

Then, the reflection noises produced at the points b flow back through the wire patterns 6 toward the buffers 3. The reflection noises are, however absorbed by the buffers 3 and can not therefore run toward other memory modules 1.

Further, since the output impedances of the buffers 3 are matched to the impedances of the wire patterns 6, the reflection noises will never be reflected again at connecting points (points a in FIG. 1) between the buffers 3 and the wire patterns 6.

Moreover, as a method of restraining the reflection noises at the points a, there can be considered a method of matching the impedances of the wire patterns 6 to the impedances of the memory modules 1. There might exist a variety of memory modules to be packaged, and it is therefore difficult to completely match the impedances of the wire patterns 6 to the impedances of the memory modules.

Such being the case, according to the memory drive circuit of the present invention, the impedance of the wire pattern 6 is determined (as well as determining the output impedance of the buffer 3) within a range of impedances that the variety of memory module can take. The determined impedance restrains thus the reflection noises from being produced at the points a as much as possible. Generally, the impedance of the memory module is on the order of 30–50 ohms Hence it is desirable that the impedance of the wire pattern 6 be matched to the output impedance of the buffer 3 within the range of 30–50 ohms.

Figure 4:
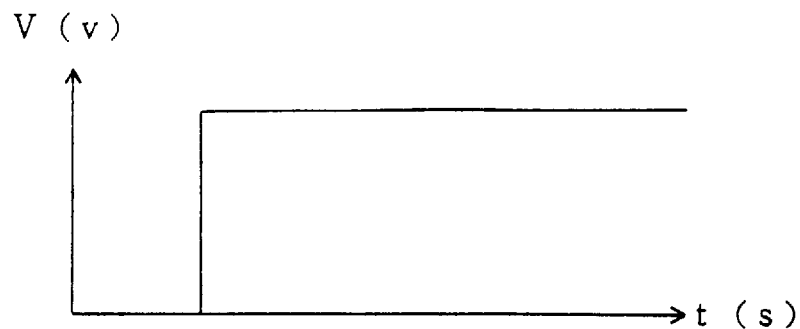
FIG. 4 is a diagram (1) showing a signal waveform at a point c in FIG. 1.
Figure 5:
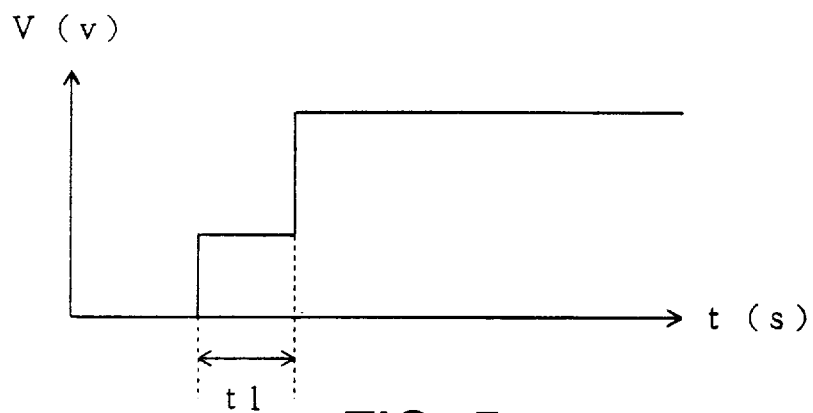
FIG. 5 is a diagram (1) showing a signal waveform at a point b in FIG. 1.

As described above, when the impedance of the buffer 3 is matched to the impedance of the wire pattern 6, as illustrated in FIG. 4, the signal obtaining a well-formed waveform rises in the farthest position (a point c in FIG. 1) from the buffer 3. At the point b closer to the buffer 3, however, as shown in FIG. 5, the signal transmitted from the buffer 3 is overlapped with the reflection noises caused in each DRAM 2 within the memory module 1. Therefore the signal does not rise, forming a stepwise waveform during a period t1 in which the reflection noises produced in the DRAM 2 in the farthest position from the point b, reach the point b) t1 the signal travels through the module and returns to the point b.

Figure 6:
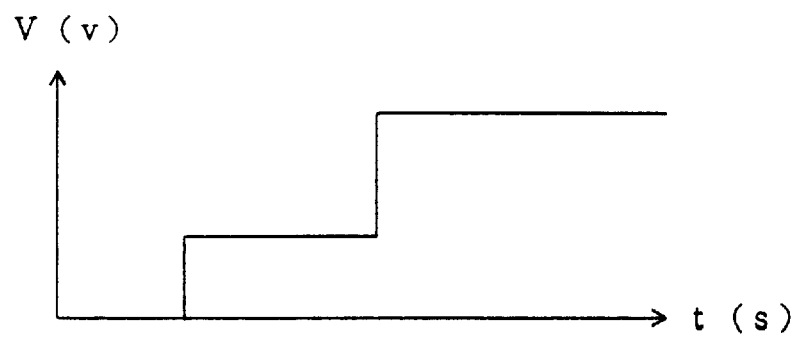
FIG. 6 is a diagram (1) showing a signal waveform at a pint a in FIG. 1.

Further, as shown in FIG. 6, it follows that the signal at the point a is also influenced by the reflection noises and rises forming the stepwise waveform.

Figure 7:
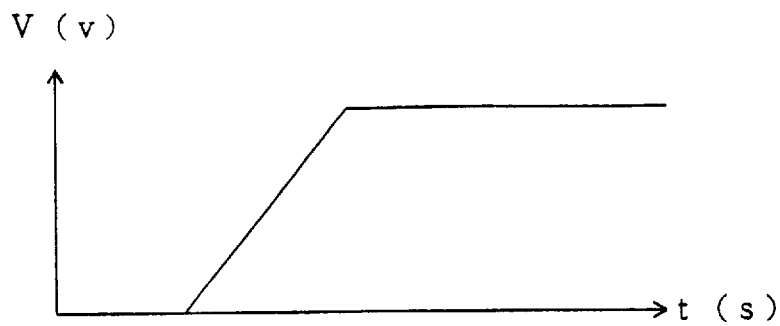
FIG. 7 is a diagram (2) showing a signal waveform at the point c in FIG. 1.
Figure 8:
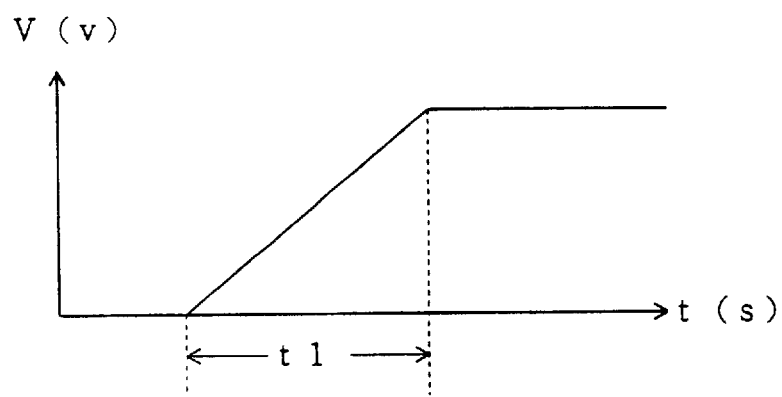
FIG. 8 is a diagram (2) showing a signal waveform at the point b in FIG. 1.
Figure 9:
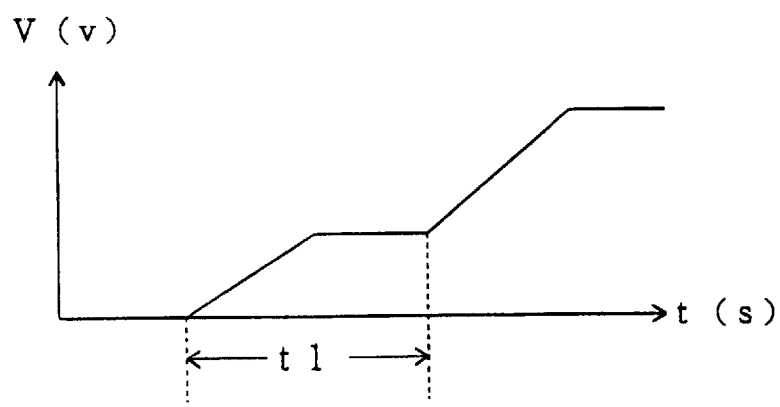
FIG. 9 is a diagram (2) showing a signal waveform at the point a in FIG. 1.
Figure 10:
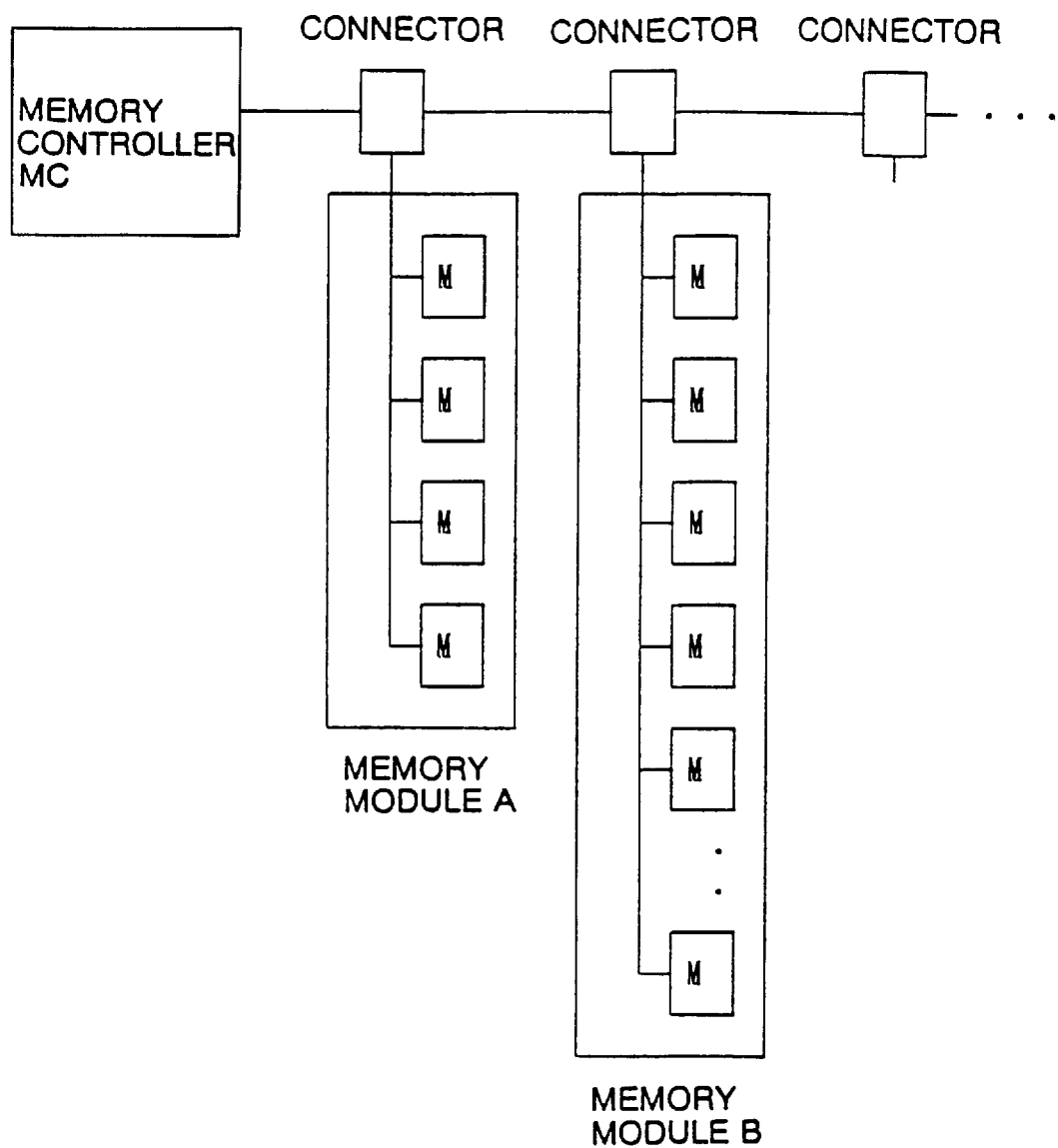
FIG. 10 is a diagram illustrating a construction of a prior art memory drive circuit.

This being the case, according to the memory drive circuit of the present invention, a transition time of the signal outputted by the buffer 3 is set coincident to or larger than a time for which the signal travels through the memory module 1 and returns to the point b. Thereby the signals at points a, b, and c rise obtaining the well-formed waveforms (see FIGS. 7, 8 and 9).

Hence, according to the memory drive circuit in this embodiment, the reflection noises produced in the memory module are absorbed by the buffer, thereby preventing the malfunction of other memory modules.

Further, superposition of the reflection noises caused in the memory module 1 does not happen at all by making the output impedance of the buffer 3 match the impedance of the wire pattern 6.

Moreover, the transition time of the signal outputted from the buffer 3 is set coincident to or larger than the signal propagation time within the memory module 1. Thereby a split portion and stepped portion are presented from being formed in the waveform of the signal and a timing error is prevented as well.

This invention being thus described, it will be obvious that the same may be varied in similar ways. Such variations are not to be regarded as a departure from the spirit and scope of the invention. All such modifications as would be obvious to one skilled in the art are intended to be included within the scope of the following claims.

What is claimed is:

1. A memory drive circuit comprising:

a memory module including a plurality of memory elements;

a memory controller driving said memory module; and a buffer, disposed between said memory module and said memory controller, receiving a drive signal from said memory controller and transmitting the received drive signal to said memory module, an output impedance of said buffer being matched to an impedance of a conductor connecting said buffer to said memory module.

2. A memory drive circuit according to claim 1, wherein: said memory module has an impedance in a predetermined range of impedances;

the impedance of the conductor connecting said buffer to said memory module is set to a value falling within the predetermined range of impedances; and a transition time of the signal output from said buffer is set coincident to or larger than a time for which the signal is propagated through said memory module.

3. A memory drive circuit comprising:

a memory module including a plurality of memory elements;

a memory controller driving said memory module; and a buffer, disposed between said memory module and said memory controller, receiving a drive signal from said memory controller and transmitting the received drive signal to said memory module, an output impedance of said buffer being matched to an impedance of a conductor connecting said buffer to said memory module; and wherein the impedance of the conductor connecting said buffer to said memory module is set to a value falling within a range of impedances that said memory module can take.

4. A memory drive circuit according to claim 3, wherein a transition time of the signal output from said buffer is set coincident to or larger than a time for which the signal is propagated through said memory module.

5. A memory drive circuit comprising:

a memory module including a plurality of memory elements;

a memory controller driving said memory module; and a buffer, disposed between said memory module and said memory controller, receiving a drive signal from said memory controller and transmitting the received drive signal to said memory module, an output impedance of said buffer being matched to an impedance of a conductor connecting said buffer to said memory module; and wherein a transition time of the signal output from said buffer is set coincident to or larger than a time for which the signal is propagated through said memory module.

6. A memory drive circuit comprising:

at least one connector to which a memory module is to be connected;

a memory controller driving the memory module; and a buffer, disposed between said connector and said memory controller, receiving a drive signal from said memory controller and transmitting the received drive signal to the memory module, an output impedance of said buffer being matched to an impedance of a conductor connecting said buffer to said memory module.

7. A memory drive circuit according to claim 6, wherein the impedance of the conductor connecting said buffer to the memory module is set to a value falling within a range of impedances that the memory module can take, and a transition time of the signal output from said buffer is set coincident to or larger than a time for which the signal is propagated through the memory module.

8. A memory drive circuit comprising:

a connector to which a memory module is to be connected;

a memory controller driving the memory module; and a buffer, disposed between said connector and said memory controller, receiving a drive signal from said memory controller and transmitting the received drive signal to the memory module, an output impedance of said buffer being matched to an impedance of a conductor connecting said buffer to the memory module; and wherein the impedance of the conductor connecting said buffer to the memory module is set to a value falling within a range of impedances that the memory module can take.

9. A memory drive circuit according to claim 8, wherein a transition time of the signal output from said buffer is set coincident to or larger than a time for which the signal is propagated through the memory module.

* * * * *

UNITED STATES PATENT AND TRADEMARK OFFICE
CERTIFICATE OF CORRECTION

PATENT NO. : 5,883,839
DATED : March 16, 1999
INVENTOR(S): Tosaka et al.

It is certified that error appears in the above-identified patent and that said Letters Patent is hereby corrected as shown below:

Col. 1,     line 8, after "include" insert --a--;
line 16, change ", and" to --.--;
line 17, change "therefore" to --Therefore--;
line 58, change "the" to --. The--.
line 65, delete "be".

Col. 3,     line 21, change "c" to --$\underline{c}$--
line 23, change "b" to --$\underline{b}$--;
line 26, change "a" to --$\underline{a}$--;
line 28, change "c" to --$\underline{c}$--;
line 30, change "b" to --$\underline{b}$--;
line 32, change "a" to --$\underline{a}$--.

Col. 5,     line 60, delete "are".

Col. 6,     line 5, delete ";";
line 7, change "MC5" to --MC 5--;
line 10, change "MC5" to --MC 5--;

line 17, change "25" (first occurrence) to --26--;
line 28, change "MC5" to --MC 5--;
line 42, change "MC5" to --MC 5--;
line 46, change "b" to --$\underline{b}$--;
line 50, change "b" to --$\underline{b}$--;
line 57, change "a" to --$\underline{a}$--;
line 60, change "a" to --$\underline{a}$--.

UNITED STATES PATENT AND TRADEMARK OFFICE
CERTIFICATE OF CORRECTION

PATENT NO. : 5,883,839
DATED     : March 16, 1999     PAGE 2 of 2
INVENTOR(S): Tosaka et al.

It is certified that error appears in the above-identified patent and that said Letters Patent is hereby corrected as shown below:

Col. 7, line 4, change "restrains thus" to --thus restrains--;
line 5, change 'a" to --$a$--;
line 7, after "ohms" insert --.--;
line 13, change "c" to --$c$--;
line 14, change "b" to --$b$--;
line 20, change "b," to --$b$--;
line 21, change "b)" to --$b$--;
line 22, change "b" to --$b$--;
line 24, change "a" to --$a$--;
line 30, change "b" to --$b$--;
line 31, change "a, b, and c" to --$a$, $b$, and $c$--; delete "the".

Signed and Sealed this

Seventh Day of September, 1999

Attest:

Q. TODD DICKINSON

*Attesting Officer*     *Acting Commissioner of Patents and Trademarks*